United States Patent [19]

Tsujimoto et al.

[11] Patent Number: 4,881,202

[45] Date of Patent: Nov. 14, 1989

[54] SEMICONDUCTOR MEMORY DEVICE USING PARTIAL DECODERS FOR REDUNDANCY

[75] Inventors: Jun-ichi Tsujimoto, Yokohama; Masataka Matsui, Tokyo; Hiroshi Iwai, Kawasaki; Takayuki Ohtani, Tokyo, all of Japan

[73] Assignee: Kabushiki Kaisha Toshiba, Kawasaki, Japan

[21] Appl. No.: 138,800

[22] Filed: Dec. 29, 1987

[30] Foreign Application Priority Data

Jan. 6, 1987 [JP] Japan .................................. 62-832

[51] Int. Cl.$^4$ .............................................. G11C 7/00
[52] U.S. Cl. ................................ 365/200; 365/230.06
[58] Field of Search ................................ 365/200, 230

[56] References Cited

U.S. PATENT DOCUMENTS 4,720,817  1/1988  Childers ............................. 365/200
4,748,597  5/1988  Saito et al. ......................... 365/200

OTHER PUBLICATIONS

Kokkonen et al., "Redundancy Techniques for Fast Static Rams," IEEE International Solid-State Circuits Conference, pp. 80-81, 2/18/81.

Primary Examiner—James W. Moffitt
Attorney, Agent, or Firm—Finnegan, Henderson, Farabow, Garrett, and Dunner

[57] ABSTRACT

In a semiconductor memory device with normal word lines and spare word lines, a partial decoder receives and decodes a predetermined two of the bit signals of the original logic levels of an address signal, and two of the bit signals of the complementary logic levels, which correspond to the predetermined two bit signals, and outputs different signal combinations of the predetermined two bit signals and the two corresponding bit signals. A spare word line selecting circuit receives the different signals and selects one of the different signals in order to select a spare word line which corresponds to a normal word line to which a defective cell is connected. The partial decoder may be used for both the normal word line selection and the selection of spare word lines. With a device constructed in such a manner, bit signals of an address signal are not directly input to the spare word line selecting circuit, but rather signals of different bit signal combinations are input to it. The spare word line selecting circuit merely selects signals of different combinations, and does not need the partial decoding of the address signal. Therefore, the chip area required for wiring may be remarkably reduced when compared with the conventional memory device.

6 Claims, 4 Drawing Sheets

SEMICONDUCTOR MEMORY DEVICE USING PARTIAL DECODERS FOR REDUNDANCY

BACKGROUND OF THE INVENTION

This invention relates to a semiconductor memory device having normal word lines and spare word lines.

As the packing density of LSI (large scale integration) is increased, defective memory cells formed on a semiconductor chip are increased.

In order to increase the yield of the memory cells, spare memory cells are provided on the semiconductor chip. The address of a normal, i.e., regular, word line to which a defective cell is connected is assigned to a spare word line to which a cell corresponding to the defective cell is connected. With this measure, when the normal word line to which a defective cell is connected is designated by an address signal, the corresponding spare word line is selected. As a result, the corresponding spare cell connected to the spare word line is selected so that a true data is read out of the spare cell.

In order to assign the address of the normal word line to which a defective memory cell is connected to the spare word line, an address assigning circuit is used. A typical assigning circuit has such a structure as shown in FIG. 1.

In spare word line selecting circuit S1 shown in FIG. 1, FC1 and FC2 designate fuse circuits. By blowing out the fuse (not shown) in fuse circuit FC1, the logic levels of signals P1 and $\overline{P1}$ are changed. When the logic levels of signals P1 and $\overline{P1}$ are changed, logic levels of the output signals of transfer gates Ta1 and Tb1 are so changed that the transfer gate which have been disabled is enabled, while the transfer gate which have been enabled is disabled. In other words, the address signal X1 or its inverted signal $\overline{X1}$, which are input to address assigning circuit S1, is selected depending on whether the fuse of fuse circuit FCI is blown out or not. The selected address signal X1 or $\overline{X1}$ is transferred via signal line L1 to one of two input terminals of spare partial decoder SPD1 made of NAND gate 11 and inverter 12.

Address signal X2 or $\overline{X2}$, which is selected by the circuit comprising fuse circuit FC2 and transfer gate Ta2 and Tb2, is supplied via signal line L2 to the other input terminal of spare partial decoder SPD1. An output signal of spare partial decoder SPD1 is output via output line L12.

For other address signals (these will be designated as X3 to X8 if the address is made up of 8 bits), spare word line selecting circuits S2 to S4 each having the same structure as that of spare word line selecting circuit S1 are provided. Circuits S2 to S4 have the same structure as that of selecting circuit S1, therefore, the descriptions thereof being omitted. The output signal of selecting circuit S1 is supplied via signal line L12 to spare decoder D1 including NAND gate 13 and inverter 14. Output signals of other selecting circuits S2 to S4 are also supplied to spare decoder D1 via signal lines L34, L56, and L78, respectively.

An address of a defective-cell-connected normal word line is programmed in spare word line selecting circuits SC1 to SC4 by selectively burning out the fuses of fuse circuits FC1 and FC2 by applying the laser beam to it or flowing a large current therethrough. When an address signal for designating the address of the defective-cell-connected normal word line is input to the memory device, spare decoder D1 decodes this address signal and produces a signal to select the corresponding spare word line.

In the spare word line selecting circuit thus arranged, the address signal is decoded for each pair of bits, e.g. X1 and X2. For this reason, each spare partial decoder needs a pair of input wirings and a single output wire. For example, in the case of spare partial decoder SPD1 for partial decoding address signals X1 and X2, the input wirings are L1 and L2, and the output wiring is L12.

Therefore, when the address signal consists of 8 bits, four spare partial decoders are required. Then, the number of wirings provided for a single word line are 12. When 8 spare word lines are used for 8 lines, the number of the required wirings is $12 \times 8 = 96$.

As described above, with increase of the package density of LSI (large scale integration), the production of semiconductor memory devices suffers from an increasing number of defective cells in a semiconductor chip. Therefore, the number of selectable spare cells, i.e., the number of spare word lines must be large.

However, the increased number of wirings leads to the increase of the chip size, as described above.

SUMMARY OF THE INVENTION

Accordingly, an object of this invention is to provide a semiconductor memory which can be provided with a number of spare cells without increasing the chip size.

According to this invention, there is provided a semiconductor memory device with normal word lines and spare word lines, comprising:

an address buffer for receiving a plurality of bit signals forming an address signal, and generating bit signals of the original logic levels, and bit signals of the complementary logic levels;

a partial decoder for receiving and decoding a predetermined two of said bit signals of the original logic levels and two of said bit signals of the complementary logic levels, which correspond to said predetermined two bit signals, and outputting different signal combinations of said predetermined two bit signals and said two corresponding bit signals; and a spare word line selecting circuit for receiving said different signals and selecting one of said different signals, in order to select a spare word line which corresponds to a normal word line of which a defective cell is connected.

The partial decoder may be used for both the normal word line selection and the selection of spare word lines.

With a device constructed in such a manner, bit signals of an address signal are not directly input to the spare word line selecting circuit, but rather signals of different bit signal combinations are input to it. The spare word line selecting circuit merely selects signals of different combinations, and does not need the partial decoding of the address signal.

Therefore, the chip area required for wiring, may be remarkably reduced when compared with the conventional memory device.

According to this invention, there is provided a semiconductor memory device with normal word lines and spare word lines, comprising:

an address buffer for receiving a plurality of bit signals forming an address signal, and generating bit signals of the original logic levels and bit signals of the complementary logic levels;

a plurality of first partial decoders each for receiving and decoding a predetermined two of said bit signals of the original logic levels and two of said bit signals of the complementary logic levels, which correspond to said predetermined two bit signals, and outputting different signal combinations of said predetermined two bit signals and said two corresponding bit signals;

a plurality of spare word line selecting circuits each for receiving said different signals output from the corresponding one of said first partial decoders and selecting one of said different signals, in order to select a spare word line which corresponds to a normal word line of which a defective cell is connected; and a second partial decoder for receiving the signals selected by said spare word line selecting circuits and taking the logical product of the selected signals to produce the logical product signal, in order to select said spare word line.

The first partial decoders may be used for both the normal word line selection and the selection of spare word lines.

With a device constructed in such a manner, bit signals of an address signal are not directly input to the spare word line selecting circuits, but rather signals of different bit signal combinations are input to them. The spare word line selecting circuits merely select signals of different combinations, and do not need the partial decoding of the address signal.

Therefore, the chip area required for wiring may be remarkably reduced when compared with the conventional memory device.

DETAILED DESCRIPTION OF THE PREFERRED EMBODIMENT

Figure 1:
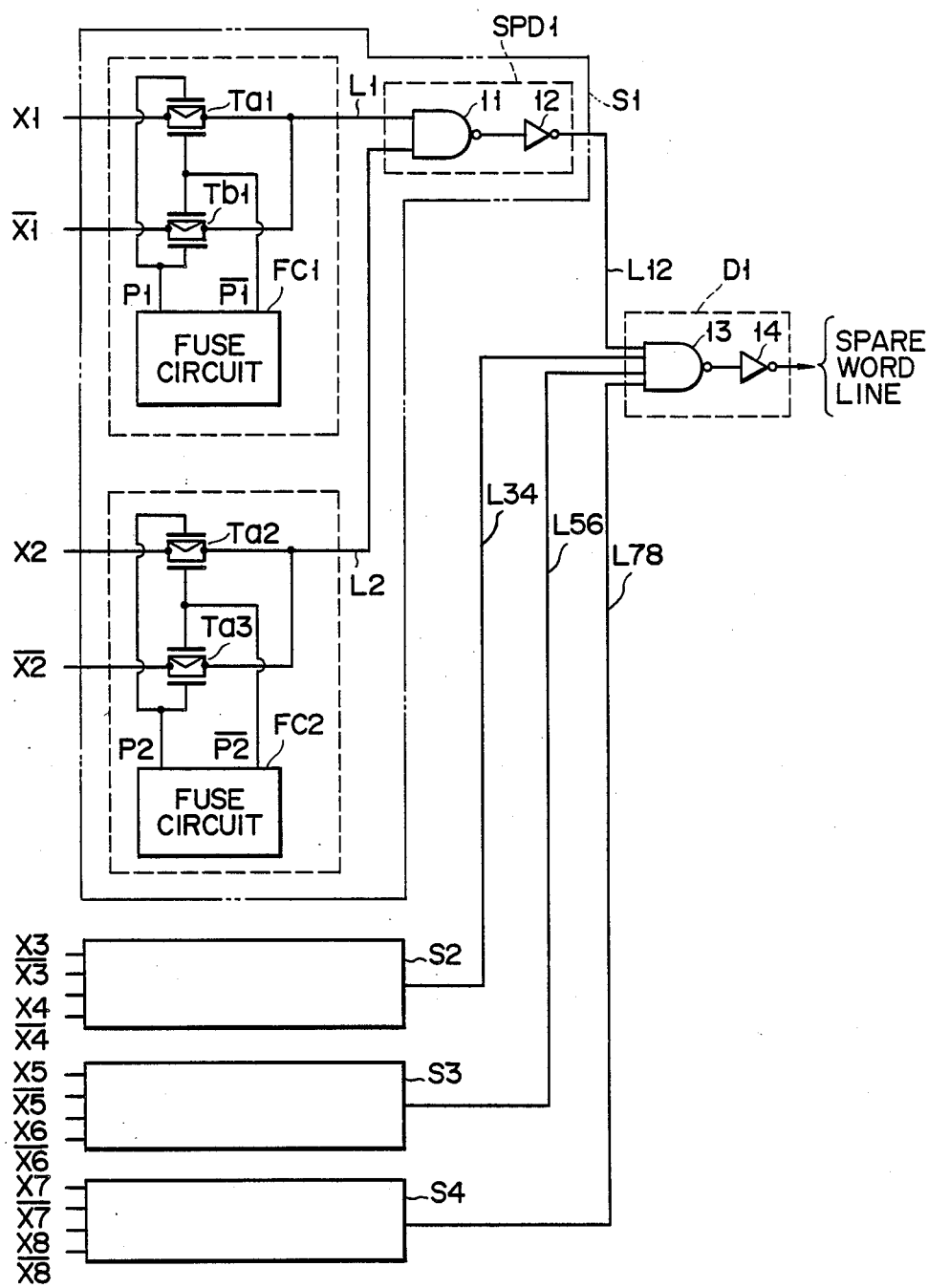
FIG. 1 is a circuit diagram of a conventional semiconductor memory device, illustrating mainly the address select circuits in the memory device.
Figure 2A:
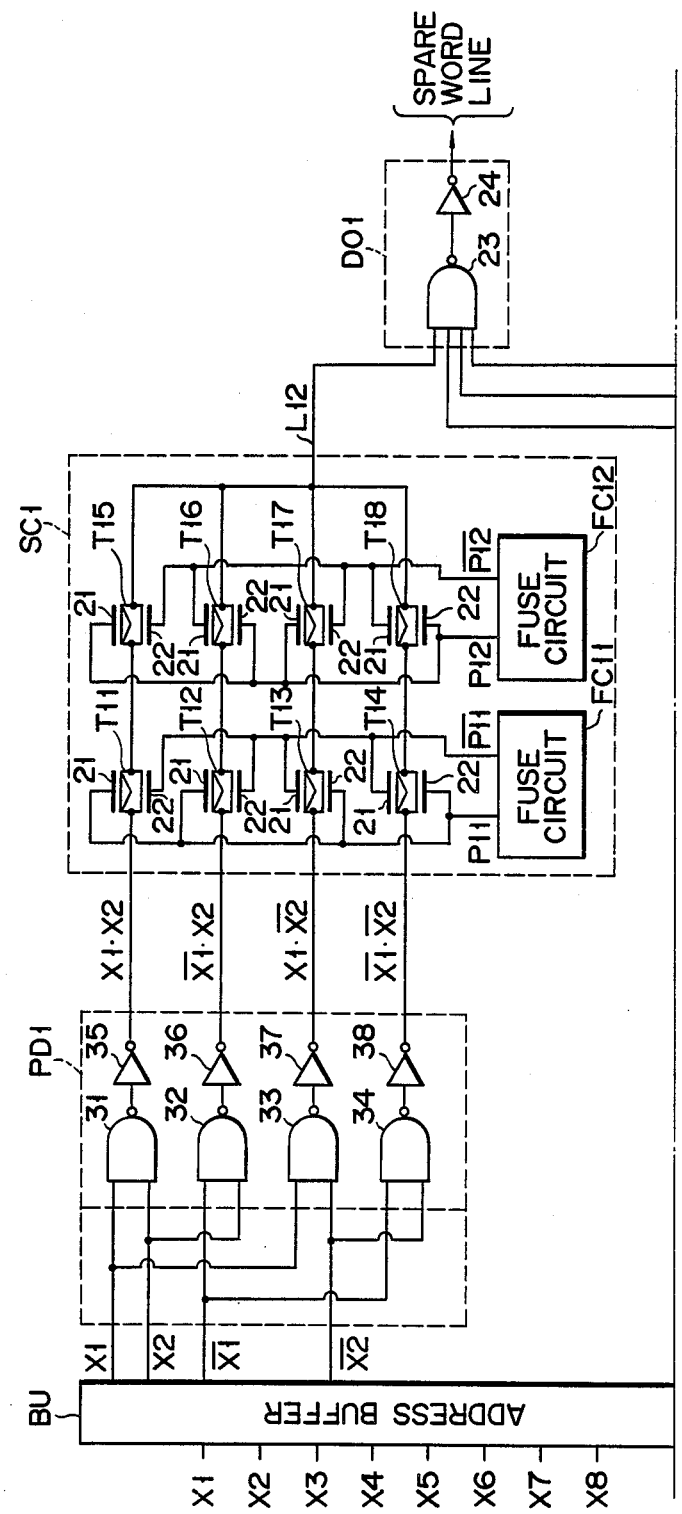
FIGS. 2A and 2B show a circuit diagram of a semiconductor memory device according to an embodiment of this invention, illustrating mainly the address select circuits.
Figure 2B:
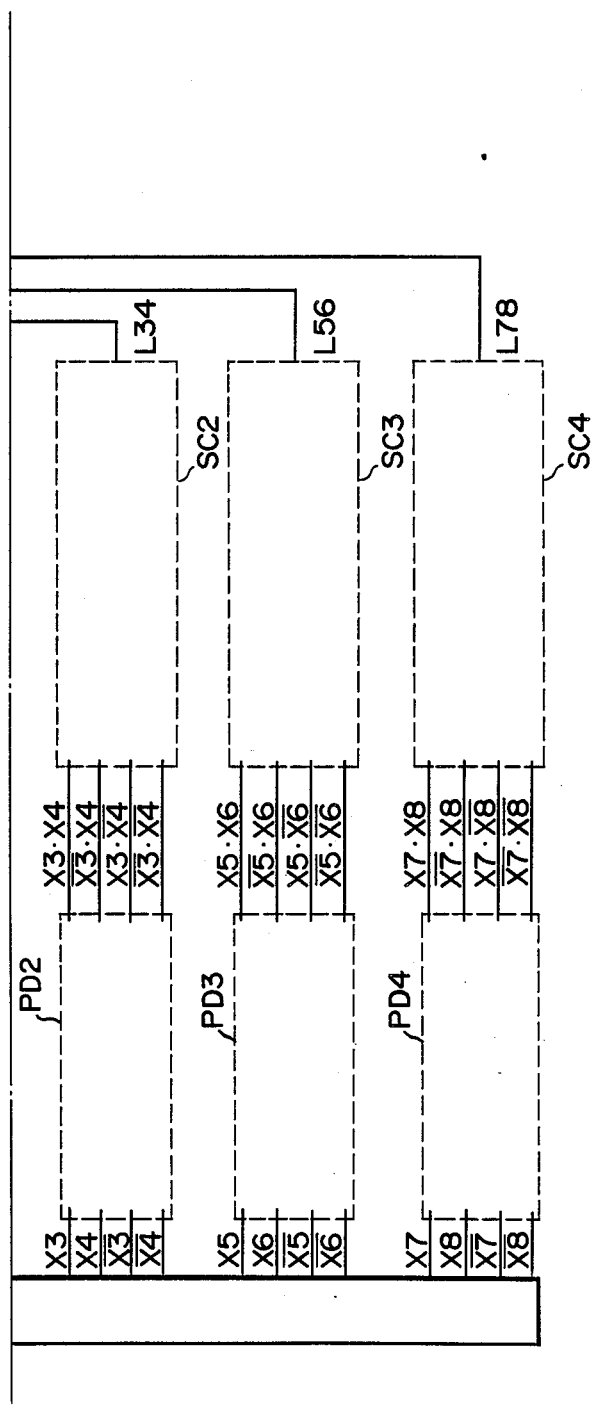

Referring to FIGS. 2A and 2B, a semiconductor memory device according to an embodiment of this invention will be described.

8-bit signals X1, X2, ..., X8 forming an address signal are input to address buffer BU. Address buffer BU receives the bit signals and generates bit signals of the original logic levels, i.e., X1, X2, ..., X8, and bit signals of the complementary logic levels, i.e., $\overline{X1}$, $\overline{X2}$, ..., $\overline{X8}$. Original level bit signals X1, X2 and the complementary level bit signals $\overline{X1}$, $\overline{X2}$ are input to partial decoder PD1.

Partial decoder PD1 receives and decodes original level bit signals X1, X2 and the complementary level bit signal $\overline{X1}$, $\overline{X2}$, and outputs different signals X1·X2, $\overline{X1}$·X2, X1·$\overline{X2}$, $\overline{X1}$·$\overline{X2}$ of different combinations of original logic level bit signals, X1, X2 and complementary level bit signals $\overline{X1}$, $\overline{X2}$.

As shown in FIG. 2B, original level bit signals X3, X4 and the complementary level bit signals $\overline{X3}$, $\overline{X4}$ are input to partial decoder PD2. Partial decoder PD2 receives and decodes original level bit signals X3, X4 and the complementary level bit signals $\overline{X3}$, $\overline{X4}$, and outputs different signals X3·X4, $\overline{X3}$·X4, X3·$\overline{X4}$, $\overline{X3}$·$\overline{X4}$ of different combinations of original level bit signals X3, X4 and the complementary level bit signals $\overline{X3}$, $\overline{X4}$. Original level bit signals X5, X6 and the complementary level bit signals $\overline{X5}$, $\overline{X6}$ are input to partial decoder PD3. Partial decoder PD3 receives and decodes original level bit signals X5, X6 and the complementary level bit signals $\overline{X5}$, $\overline{X6}$, and outputs different signals X5·X6, $\overline{X5}$·X6, X5·$\overline{X6}$, $\overline{X5}$·$\overline{X6}$ of different combinations of original level bit signals X5, X6 and the complementary level bit signals $\overline{X5}$, $\overline{X6}$. Original level bit signals X7, X8 and the complementary level bit signals $\overline{X7}$, $\overline{X8}$ are input to partial decoder PD4. Partial decoder PD4 receives and decodes original level bit signals X7, X8 and the complementary level bit signals $\overline{X7}$, $\overline{X8}$, and outputs different signals X7·X8, $\overline{X7}$·X8, X7·$\overline{X8}$, $\overline{X7}$·$\overline{X8}$ of different combinations of original level bit signals X7, X8 and complementary level bit signals $\overline{X7}$, $\overline{X8}$.

Signals X1·X2, $\overline{X1}$·X2, X1·$\overline{X2}$, $\overline{X1}$·$\overline{X2}$ are input to spare word line selecting circuit SC1. Signals X3·X4, $\overline{X3}$·X4, X3·$\overline{X4}$, $\overline{X3}$·$\overline{X4}$ are input to spare word line selecting circuit SC2. Signals X5·X6, $\overline{X5}$·X6, X5·$\overline{X6}$, $\overline{X5}$·$\overline{X6}$ are input to spare word line selecting circuit SC3. Signals X7·X8, $\overline{X7}$·X8, X7·$\overline{X8}$, $\overline{X7}$·$\overline{X8}$ are input to spare word line selecting circuit SC4.

Spare word line selecting circuit SC1 receives signals X1·X2, $\overline{X1}$·X2, X1·$\overline{X2}$, $\overline{X1}$·$\overline{X2}$, and selects one of signals X1·X2, $\overline{X1}$·X2, X1·$\overline{X2}$, $\overline{X1}$·$\overline{X2}$, according to whether or not fuses (denoted by FE in FIG. 3, though not shown in FIGS. 2A and 2B) in fuse circuits FC11 and FC12 in the selecting circuit SC1, are burned out.

Spare word line selecting circuit SC2 receives signals X3·X4, $\overline{X3}$·X4, X3·$\overline{X4}$, $\overline{X3}$·$\overline{X4}$, and selects one of signals X3·X4, $\overline{X3}$·X4, X3·$\overline{X4}$, $\overline{X3}$·$\overline{X4}$, according to whether or not fuses in fuse circuits (not shown) in the selecting circuit SC2 are burned out. Spare word line selecting circuit SC3 receives signals X5·X6, $\overline{X5}$·X6, X5·$\overline{X6}$, $\overline{X5}$·$\overline{X6}$, and selects one of the above mentioned signals, X5·X6, $\overline{X5}$·X6, X5·$\overline{X6}$, $\overline{X5}$·$\overline{X6}$, according to whether or not fuses in fuse circuits (not shown) in the selecting circuit SC3 are burned out.

Spare word line selecting circuit SC4 receives signals X7·X8, X7·X8, X7·X8, X7·X8, and selects one of signals X7·X8, $\overline{X7}$·X8, X7·$\overline{X8}$, $\overline{X7}$·$\overline{X8}$, according to whether or not fuses in fuse circuits (not shown) in the selecting circuit SC4 are burned out.

Selected signals of the selecting circuits SC1 to SC4 are input to spare partial decoder D01 via signal lines L12, L34, L56, L78. Spare partial decoder D01 receives and decodes the selected signals, and outputs a signal for selecting a spare word line which corresponds to a defective-cell-connect normal word line.

Partial decoders PD1 to PD4 have the same construction. Therefore, only the partial decoder PD1 is illustrated in detail, and the remaining partial decoder are only illustrated with blocks for simplicity of illustration. Partial decoders normally provided at the prestage of the normal or regular decoder (not shown) for selecting regular word lines are commonly used as partial decoders PD1 to PD4. Partial decoder PD1 is composed of NAND gates 31 to 34 and inverters 35 to 38.

In partial decoder PD1, signals X1 and X2 are input to NAND gate 31, signals $\overline{X1}$ and X2 are input to NAND gate 32, signals X1 and $\overline{X2}$ are input to NAND gate 33, and signals $\overline{X1}$ and $\overline{X2}$ are input to NAND gate 34. Inverters 35 to 38 receives outputs of NAND gates 31 to 34, and produce signals X1·X2, $\overline{X1}$·X2, X1·$\overline{X2}$, and $\overline{X1}$·$\overline{X2}$, respectively.

Spare word line selecting circuits SC1 to SC4 have the same structure. Therefore, only selecting circuit SC1 is illustrated in detail, and remaining selecting circuits SC2 to SC4 are illustrated with blocks for simplicity of illustration. Selecting circuit SC1 is composed of fuse circuits FC11 and FC12, and transfer gates T11 to T18. Each transfer gate is comprised of P channel MOS transistors 21 and N channel MOS transistor 22.

Transfer gates T11 and T15 are connected in series. Similarly, transfer gates T12 and T16, T13 and T17, and T14 and T18 are each connected in series. The series-connected transfer gates are coupled to partially decoded signals X1·X2, $\overline{X1}$·X2, X1·$\overline{X2}$, and $\overline{X1}$·$\overline{X2}$, respectively.

Signal P11 of fuse circuit FC11 is supplied to the gates of the P channel transistors 21 in transfer gates T11 and T12, and the gates of the N channel transistors 22 of the transfer gates T13 and T14. Signal $\overline{P11}$ of fuse circuit FC11 is supplied to the gates of the N channel transistors 22 in transfer gates T11 and T12, and the gates of the P channel transistors 21 of the transfer gates T13 and T14.

Signal P12 of fuse circuit FC12 is supplied to the gates of the P channel transistors 21 in transfer gates T15 and T17, and the gates of the N channel transistors 22 of the transfer gates T16 and T18. Signal $\overline{P12}$ of fuse circuit FC12 is supplied to the gates of the N channel transistors 22 in transistors T15 and T17, and the gates of the P channel transistors 21 of the transfer gates T16 and T18.

Transfer gates T11 to T14 are controlled by signals P11 and $\overline{P11}$ of fuse circuit FC11. Transfer gates T15 to T18 are controlled by signals P12 and $\overline{P12}$ of fuse circuit FC12.

Thus, when the fuse of fuse circuit FC11 is burned out to change the logic states of signals P11 and $\overline{P11}$, of those transfer gates T11 to T14, the transfer gate having been enabled before the fuse is burned out is disabled, while the transfer gate having been disabled before the fuse is burned out is enabled. Transfer gates T11 and T12 are both placed in the same state, i.e., in the enabled state or the disabled state. Transfer gates T13 and T14 are both placed in the same state, but in the state opposite to that of transistors T11 and T12. That is, when transfer gates T11 and T12 are disabled, transfer gates T13 and T14 are enabled, while the former are enabled, the latter are disabled.

Similarly, when the fuse of fuse circuit FC12 is burned out to change the logic states of signals P12 and $\overline{P12}$, of those transfer gates T15 to T18, the transfer gate having been enabled before the fuse is burned out is disabled, while the transfer gate having been disabled before the fuse is burned out is enabled. Transfer gates T15 and T17 are both placed in the same state, i.e., in the enabled state or the disabled state. Transfer gates T16 and T18 are both placed in the same state, but in the state opposite to that of transfer gates T15 and T17.

Thus, one of the circuit composed of transfer gates T11 and T15, the circuit composed of transfer gates T12 and T16, the circuit composed of transfer gates T13 and T17, and the circuit composed of transfer gates T14 and T18 is opened, depending on a combination of the states whether or not the fuse of fuse circuit FC11 is burned out, and whether or not the fuse of fuse circuit FC12 is burned out. As a result, one of signals X1·X2, $\overline{X1}$·X2, X1·$\overline{X2}$, and $\overline{X1}$·$\overline{X2}$ is selected, and is input to spare partial decoder D01 composed of NAND gate 23 and inverter 24 via signal line L12.

The same thing is true for the selecting circuits SC2 to SC4 for other address signals. Only the signal from the partial decoder which is selected depending on whether or not the states of the fuses of the fuse circuits in each selecting circuits SC2 to SC4, is input to spare partial decoder D01, via signal lines L34, L56 and L78.

As seen from the foregoing, by selectively burning out the fuses in the fuse circuits in each selecting circuit so that the addresses of defective-cell-connected normal word lines are programmed, the signal for selecting the spare-cell-connected spare word line can be output from spare decoder D01 in response to the address signal for selecting a defective-cell-connected normal word line.

In the circuit arrangement as mentioned above, the partial decode signal for selecting the regular word line is used as an input address signal to the spare word line selecting circuit. In other words, partial decoders PD1 to PD4 are used for both the selection of the normal word lines and the selection of the spare word lines. This feature eliminates the necessity of providing the spare partial decoder for each spare word line selecting circuit. The input wirings L1 and L2 for the spare partial decoder, which are essential for the conventional memory device, are not required. The required wiring is only the wiring L12 to spare decoder D01. Thus, the number of wirings is considerably reduced.

For example, if the address signal consists of 8 bits, the number of wirings for a single word line is four. If 8 word lines are provided for 8 rows, the required number of wirings is only 32 wirings.

While the above-mentioned embodiment has been described for the 8-bit address signal of X1 to X8, it is evident that this invention is applicable for the 2-bit, 4-bit, 16-bit, 32-bit, 64-bit address signal and so on. If the semiconductor memory device is of 2-bit structure, spare partial decoder D01 in FIGS. 2A and 2B is not required.

In the LSI memory, the chip area for wirings hinders the increasing of the package density of the LSI. To the contrary, the redundancy circuit with a lesser number of wirings, as mentioned above, enables the number of spare cells to be increased without increasing the chip area.

Figure 3:
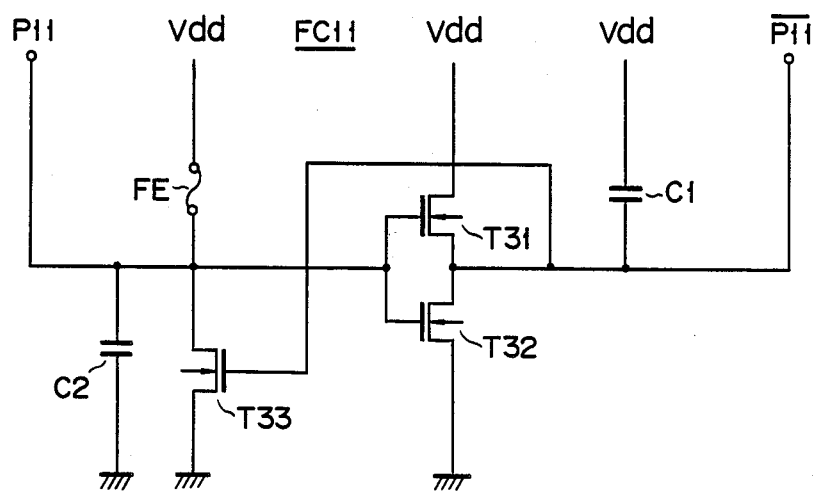
FIG. 3 is a circuit diagram of a fuse circuit incorporated in the semiconductor memory device shown in FIGS. 2A and 2B.

FIG. 3 shows a circuit diagram of fuse circuit FC11 incorporated in the semiconductor memory device shown in FIGS. 2A and 2B.

Fuse circuit FC11 comprises fuse FE, P channel MOS transistor T31, N channel MOS transistors T32 and T33, and two capacitors C1 and C2 having substantially the same capacitance. P channel MOS transistor T31 and N channel MOS transistors T32 form a complementary MOS inverter. Reference character Vdd denotes a power source potential.

When fuse FE is not blown, P channel MOS transistor T31 and N channel MOS transistors T33 are turned off and N channel MOS transistors T32 is turned on. Therefore, output signal P11 of fuse circuit FC11 has the "1" logic level, and output signal $\overline{P11}$ thereof has the "0" logic level. On the other hand, when fuse FE is blown, P channel MOS transistor T31 and N channel MOS transistors T33 are turned on and N channel MOS transistors T32 is turned off. Therefore, output signal P11 of fuse circuit FC11 has the "0" logic level, and output signal $\overline{P11}$ thereof has the "1" logic level.

Fuse circuit FC12 has substantially the same construction as that of fuse circuit FC11, and the description of fuse circuit 12 is omitted.

As described above, according to this invention, there is provided a semiconductor memory device which can contain a number of spare cells without increasing chip area.

What is claimed is:

1. A semiconductor memory device including a plurality of cells subject to defects and having normal word lines and spare word lines connected to said cells, comprising:
    an address buffer for receiving a plurality of bit signals forming an address signal, and generating bit signals of the original logic levels of the received bit signals and bit signals of the complementary logic levels of the received bit signals;
    a plurality of first partial decoders, each for receiving and decoding a predetermined two of said bit signals of the original logic levels and two of said bit signals of the complementary logic levels corresponding to said predetermined two bit signals, and outputting different signal combinations of said predetermined two bit signals and said two corresponding bit signals;
    a plurality of spare word line selecting circuits, each for receiving said different signal combinations output from the corresponding one of said first partial decoders and selecting one of said different signal combinations; and
    a second partial decoder for receiving the signal combinations selected by said spare word line selecting circuits and taking the logical product of the selected signal combinations to produce a logical product signal, in order to select a spare word line which corresponds to a normal word line to which a defective cell is connected.

2. A semiconductor memory device according to claim 1, in which each of said first partial decoders is used for both the selection of the normal word lines and the selection of the spare word lines.

3. A semiconductor memory device according to claim 1, in which each of said spare word line selecting circuits comprises a fuse circuit, the logic level of whose output signal is changed depending on whether the fuse is blown or not, and a transfer gate circuit controlled by the output signal of said fuse circuit.

4. A semiconductor memory device with normal word lines and spare word lines, comprising:
    an address buffer for receiving a plurality of bit signals forming an address signal, and generating bit signals of the original logic levels of the received bit signals and bit signals of the complementary logic levels of the received bit signals;
    a plurality of first partial decoders, each for receiving and decoding a predetermined two of said bit signals of the original logic levels and two of said bit signals of the complementary logic levels corresponding to said predetermined two bit signals, and outputting different signal combinations of said predetermined two bit signals and said two corresponding bit signals;
    a plurality of spare word line selecting circuits, each having a plurality of transfer gate circuits, each spare word line selecting circuit for receiving said different signal combinations output from the corresponding one of said first partial decoders and for inputting each of said different signal combinations into a corresponding one of said plurality of transfer gate circuits to select one of said different signal combinations; and
    a second partial decoder for receiving the signal combinations selected by said spare word line selecting circuits and taking the logical product of the selected signal combinations to produce a logical product signal, in order to select a spare word line which corresponds to a normal word line to which a defective cell is connected.

5. A semiconductor memory device according to claim 4, wherein each of said first partial decoders is used for both the selection of the normal word lines and the selection of the spare word lines.

6. A semiconductor memory device according to claim 4, wherein each of said spare word line selecting circuits comprises a fuse circuit, having an output signal whose logic level is changed depending on whether the fuse is blown or not, and wherein at least one of the transfer gate circuits are controlled by the output signal of said fuse.

* * * * *